United States Patent
Kobatake

[11] Patent Number: 5,812,460
[45] Date of Patent: Sep. 22, 1998

[54] NONVOLATILE SEMICONDUCTOR MEMORY DEVICE HAVING TEST CIRCUIT FOR TESTING ERASING FUNCTION THEREOF

[75] Inventor: Hiroyuki Kobatake, Tokyo, Japan

[73] Assignee: NEC Corporation, Tokyo, Japan

[21] Appl. No.: 974,670

[22] Filed: Nov. 19, 1997

[30] Foreign Application Priority Data

Nov. 21, 1996 [JP] Japan .................................... 8-310785

[51] Int. Cl.$^6$ .................................................. G11C 16/04
[52] U.S. Cl. ................... 365/185.29; 365/185.11; 365/185.22
[58] Field of Search .................. 365/185.29, 185.11, 365/185.12, 185.22, 185.33, 201

[56] References Cited

U.S. PATENT DOCUMENTS 5,561,631  10/1996  Curd .................................... 365/185.22
5,615,154  3/1997   Yamada ............................... 365/185.22
5,617,359  4/1997   Ninomiya ............................ 365/185.29

FOREIGN PATENT DOCUMENTS 4-260000  9/1992  Japan .

Primary Examiner—Son Mai
Attorney, Agent, or Firm—Sughrue, Mion, Zinn, Macpeak & Seas, PLLC

[57] ABSTRACT

The nonvolatile semiconductor memory of the present invention has erase circuits 30 for supplying predetermined voltage to corresponding blocks, respectively. Each of the erase circuits 30 comprises an erase address detection circuit 33 for detecting whether an erase transistor 31 conducts a switching operation in accordance with a block address signal.

5 Claims, 10 Drawing Sheets

NONVOLATILE SEMICONDUCTOR MEMORY DEVICE HAVING TEST CIRCUIT FOR TESTING ERASING FUNCTION THEREOF

BACKGROUND OF THE INVENTION

1. Field of the Invention

The present invention relates to a nonvolatile semiconductor memory device built in a microcomputer or the like, and particularly, relates to a nonvolatile semiconductor memory device for testing an erasing function thereof.

2. Description of the Related Art

As a nonvolatile semiconductor memory, there have been conventionally proposed a flash memory and an Electrically Erasable and Programmable Read Only Memory (EEPROM) capable of batch-erasing data or erasing data in units of blocks.

The nonvolatile semiconductor memory of this type requires testing erase functions of respective blocks prior to shipment as a product. The test has been conventionally conducted by the following method.

In the conventional test method, "1" is written to all memory regions and then to-be-erased blocks are sequentially selected one by one. Erase operations in units of blocks are confirmed and it is also confirmed that the to-be-erased blocks and the other blocks do not interfere with each other.

The nonvolatile semiconductor memory of this type, however, takes long time to erase data of a block. Due to this, such a test method has a disadvantage in that as storage capacitor increases, it takes considerable time to carry out the test. Assume that, for example, it takes two seconds to erase one block and that the number of blocks is 32. In that case, it takes about one minute to complete the erase test in the entire nonvolatile semiconductor memory.

To overcome the disadvantage, there has been proposed, for example, a technique disclosed in the Japanese Unexamined Patent Publication No. 4-260000 (to be referred to as Reference hereinafter).

The nonvolatile semiconductor memory in the Reference comprises a memory cell array consisting of a plurality of blocks, an erase line driver array consisting of a plurality of erase line drivers provided corresponding to the plurality of blocks and a row decoder having an erase block decoder for outputting a signal to drive the plurality of erase line drivers.

The nonvolatile semiconductor memory in the Reference is characterized in that, if a test signal transmitted from the outside is turned on, the erase block decoder provided in the row decoder outputs a signal for simultaneously driving erase line drivers to either an even number block group consisting of blocks given even numbers or an odd number block group consisting of blocks given odd numbers among the plurality of blocks in accordance with the designation of an address buffer.

Therefore, according to the nonvolatile semiconductor memory having the above-stated structure in the Reference, it is possible to confirm adjacent blocks do not interfere with one another in erase operation and to greatly shorten erase test time by conducting two erase tests, that is, an even number block group erase test and an odd numbered block group erase test.

The nonvolatile semiconductor memory in the Reference, however, has the following disadvantages.

As taught by the Reference, the erase block decoder in the nonvolatile semiconductor memory is a logic circuit wherein an address signal for designating an address and a test signal are inputted and, if the test signal is turned on, only the least significant bit among a plurality of bits constituting a binary bit string indicated by the address signal is associated with output.

In other words, in the erase block decoder in the Reference, when the test signal is turned on, the batch erase tests conducted to the above-stated even number block group and odd number block group have the same result even if significant bits other than the least significant bit of the address signal have defects.

Meanwhile, if the test signal is turned off and erase operation is carried out by actually designating respective blocks independently, parts of the erase block decoder relevant to all of the bits of the address signal have to, of course, perform normal logic operation.

Accordingly, the nonvolatile semiconductor memory in the Reference can judge whether or not adjacent blocks interfere with one another in erase operation; however, the erase test needs to be conducted by sequentially designating blocks as in the case of the conventional method if it is judged whether or not the blocks can be erased independently of one another.

As can be understood from the above, the nonvolatile semiconductor memory in the Reference disadvantageously takes great time to conduct the erase tests completely.

SUMMARY OF THE INVENTION

It is therefore an object of the present invention to provide a nonvolatile semiconductor memory capable of overcoming the above-described disadvantages of the Reference and shortening erase test time.

To obtain the above object, according to the present invention, a desired nonvolatile semiconductor memory is constituted based on a principle as described below.

Generally, erase circuits provided corresponding to the blocks comprise erase transistors for carrying out switching operations in accordance with an address signal, respectively, to supply predetermined voltage to the respective blocks in erase operation. In this case, it takes time on a second-time scale to erase the blocks whereas it takes the erase transistors only time on a nanosecond-time scale to carry out switching operations in accordance with the address signal.

According to the present invention, if a batch erase test is conducted to not only the even number block group/odd number block group but also respective blocks by designating a plurality of blocks and it is judged that the blocks can be erased without interference with one another or, that is, only if the corresponding erase transistors are turned on, then respective blocks can be erased.

Considering the above, according to the present invention, only if corresponding erase transistors are turned on, then it is judged that the blocks are erasable and thereafter it is judged whether or not the erase transistors carry out switching operations in accordance with address signals designating individual blocks to thereby shorten time required for erase tests.

Concrete means for carrying out erase tests based on the concept of the present invention will be described below.

The present invention can provide, as a first nonvolatile semiconductor memory, a nonvolatile semiconductor memory comprising: a memory cell array having a plurality of blocks consisting of a plurality of memory cells; block address signal generation means for generating a block address signal for designating a block which data is to be erased; and a plurality of erase circuits provided corresponding to the plurality of blocks, for erasing data of the corresponding blocks in response to the block address signal, respectively and characterized in that each of the plurality of erase circuits comprises: an erase transistor operating as a switching device for supplying desired, predetermined voltage to the corresponding block in accordance with the block address signal; and an erase address detection circuit for outputting an erase address detection signal indicating whether the erase transistor supplies the predetermined voltage to the corresponding block.

The present invention can also provide, as a second nonvolatile semiconductor memory, a nonvolatile semiconductor memory according to the first nonvolatile semiconductor memory, characterized in that each of the plurality of erase circuits further comprises drive signal generation means for determining whether to drive the erase transistor in response to an erase test signal sent from outside and designating a form of an erase test and to the block address signal, and for outputting a transistor drive signal to the erase transistor if it is determined to drive the erase transistor.

In addition, the present invention can provide, as a third nonvolatile semiconductor memory, a nonvolatile semiconductor memory according to the second nonvolatile semiconductor memory characterized in that the block address signal is a binary bit string having a plurality of bits; if the erase test signal is turned on, each of the drive signal generation means determines whether to drive a corresponding erase transistor depending on whether a corresponding block is an even number block or an odd number block in the memory cell array, in accordance with a least significant bit of the binary bit string constituting the block address signal, and outputs, if determining that the corresponding erase transistor is driven, the transistor drive signal to the corresponding erase transistor; and if the erase test signal is turned off, each of the drive signal generation means determines whether to drive the corresponding erase transistor only in accordance with the block address signal, and outputs, if determining that the corresponding erase transistor is drive, the transistor drive signal to the corresponding erase transistor.

Moreover, the present invention can provide, as a fourth nonvolatile semiconductor memory, a nonvolatile semiconductor memory according to the first, second or third nonvolatile semiconductor memory, is characterized in that sources of a plurality of memory cells of each block are connected to a source line in the block; and the source line is connected to a corresponding erase transistor and the predetermined voltage is supplied to the source line.

Furthermore, the present invention can provide, as a fifth nonvolatile semiconductor memory, a nonvolatile semiconductor memory according to the first, second or third nonvolatile semiconductor memory is characterized in that gates of a plurality of memory cells of each block are connected to an erase line; and the erase line is connected to a corresponding erase transistor and the predetermined voltage is supplied to the erase line.

Additionally, the present invention can provide, as a block erase test method in the third, fourth and fifth nonvolatile semiconductor memories, a block erase test method in a nonvolatile semiconductor memory characterized by comprising: a first step of erasing data of one of an even number block group consisting of even number blocks and an odd number block group consisting of odd number blocks; a second step of confirming that data of one of the even number block group and the odd number block group is completely erased and that the one block group and a remaining block group do not interfere with each other; a third step of erasing data of the remaining block group out of the even number block group and the odd number block group; a fourth step of confirming that data of the remaining block group is completely erased; and a fifth step of detecting whether the corresponding erase transistor is turned on in accordance with an address signal designating each of the plurality of blocks.

It is possible that the fourth step is a step of confirming that data of the remaining block group is completely erased and that the remaining block group and the one block group do not interfere with each other.

DETAILED DESCRIPTION OF THE PREFERRED EMBODIMENTS

Figure 1:
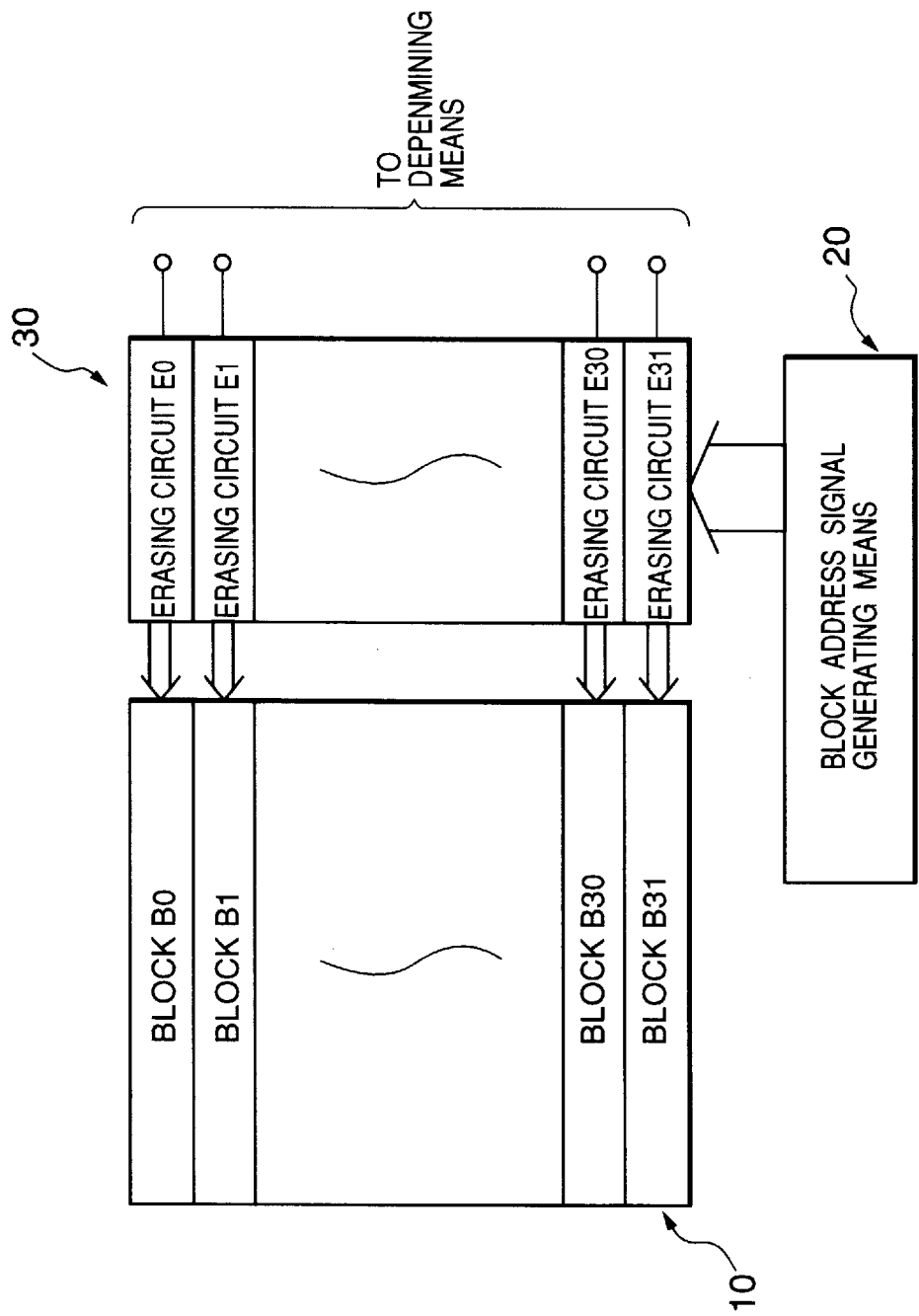
FIG. 1 is a block diagram showing the structure of a nonvolatile semiconductor memory in the first embodiment according to the present invention.
Figure 2:
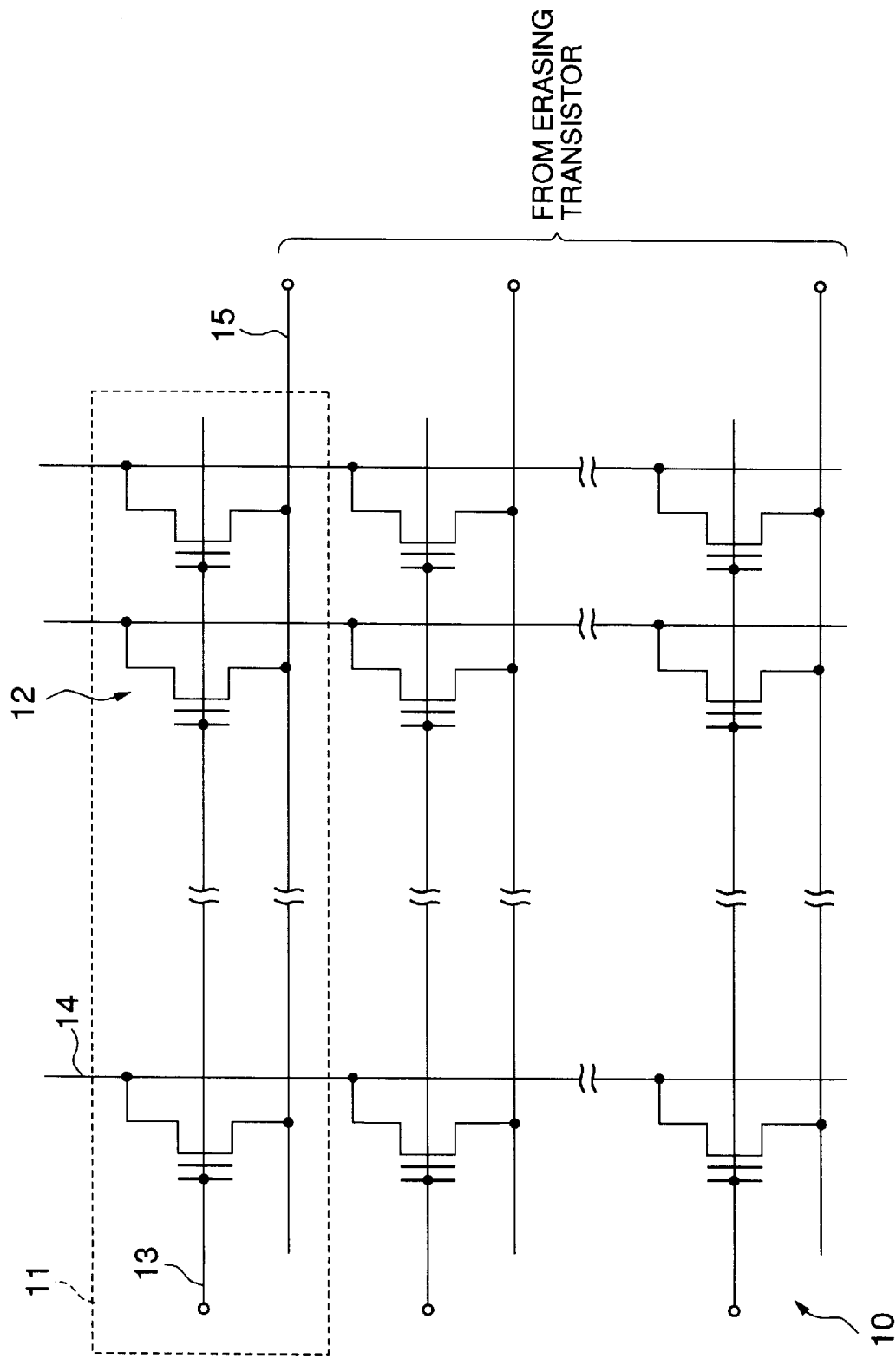
FIG. 2 shows a memory cell array in the first embodiment.

A nonvolatile semiconductor memory in the first embodiment according to the present invention comprises a memory cell array 10 consisting of a plurality of blocks B0 to B31, block address signal generation means 20 and a plurality of erase circuits E0 to E31 corresponding to the plurality of blocks B0 to B31, as shown in FIG. 1. As shown in FIG. 2, the memory cell array 10 has memory cells 12 to which a plurality of word lines 13, bit lines 14 and source lines 15 are connected, respectively. Each block (B0 to B31) 11 consists of memory cells 12, to which one word line 13 is connected. That is, in this embodiment, each block 11 is equivalent to one row of the memory cell array 10. Predetermined voltage is supplied to a source line 15 of each block 11 by an erase transistor which will be described later. In the memory cell array 10, even number block B0, B2, B4 . . .

B30 are referred to as blocks in an even number block group and odd number blocks B1, B3, B5 . . . B31 are referred to as blocks in an odd number block group.

The block address signal generation means 20 generates a block address signal for designating a block 11 which data is to be erased and outputs the block address signal to drive signal generation means included in an erase circuit corresponding to the designated block 11, which will be described later. In this embodiment, a block address signal is a binary bit string consisting of a plurality of bits.

Figure 3:
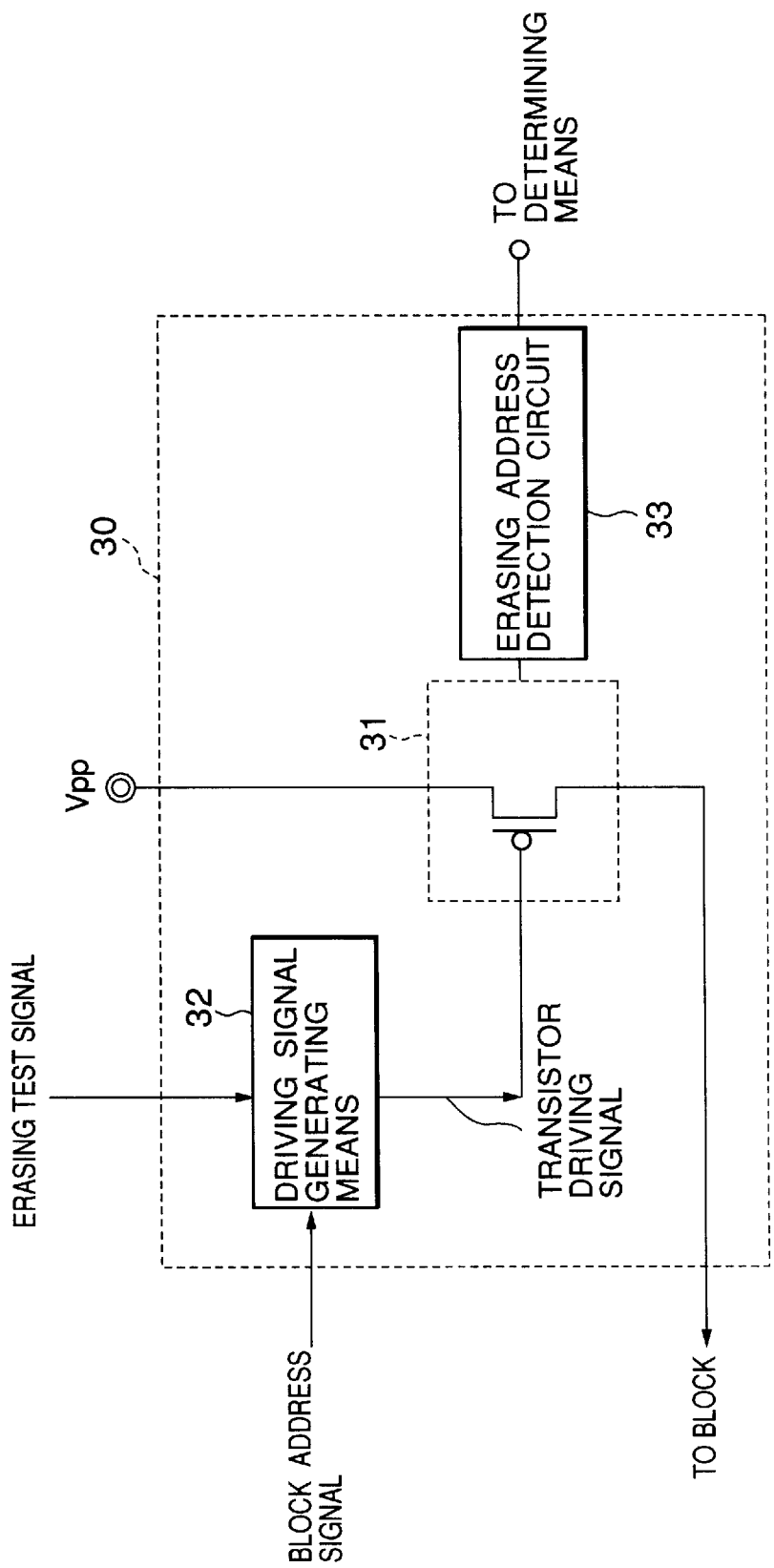
FIG. 3 shows the structure of an erase circuit in the first embodiment.

Each erase circuit (E0 to E31) 30 consists of an erase transistor 31, drive signal generation means 32 and an erase address detection circuit 33, as shown in FIG. 3.

More specifically, the erase transistor 31 operates as a switching device. That is, the transistor is driven by a transistor drive signal, which will be described later, and supplies predetermined voltage to a source line 15 of a corresponding block B0 to B11 when the erase transistor 31 carries out an erase operation.

The drive signal generation means 32 determines whether to drive the erase transistor 31 in response to both a block address signal outputted from the block address signal generation means and an erase test signal supplied from the outside. If it is determined that the erase transistor 31 should be driven, the drive signal generation means 32 outputs a transistor drive signal to the erase transistor 31. In this embodiment, the erase test signal is turned on if an erase test for batch-erasing either the even number blocks or the odd number blocks. The erase test signal is turned off if respective blocks are erased by designating them in a univocal manner. Following this, if the erase test signal is turned on, the drive signal generation means 32 determines that either the odd number block group or the even number block group is batch-designated in accordance with "0" or "1" indicated by the least significant bit in the binary bit string constituting the block address signal. If the corresponding block is in the designated block group, the drive signal generation means 32 outputs the above-mentioned transistor drive signal to the erase transistor 31. Meanwhile, if the erase signal is turned off, the drive signal generation means 32 determines whether to drive the erase transistor 31 in accordance with all of the bits of the binary bit string constituting the block address signal. As can be understood from the above description, if the test signal is turned on, values of bits other than the least significant bit in the binary bit string constituting the block address signal can be freely chosen. They do not influence the determination of whether to drive an erase transistor 31.

The erase address detection circuit 33 detects whether or not the erase transistor 31 is turned on in accordance with the transistor drive signal from the drive signal generation means 32. That is, it detects whether or not the erase transistor 31 supplies predetermined voltage to the corresponding block 11. The erase address detection circuit 33 then outputs the detection result as an erase address detection signal to determination means (not shown).

Figure 4:
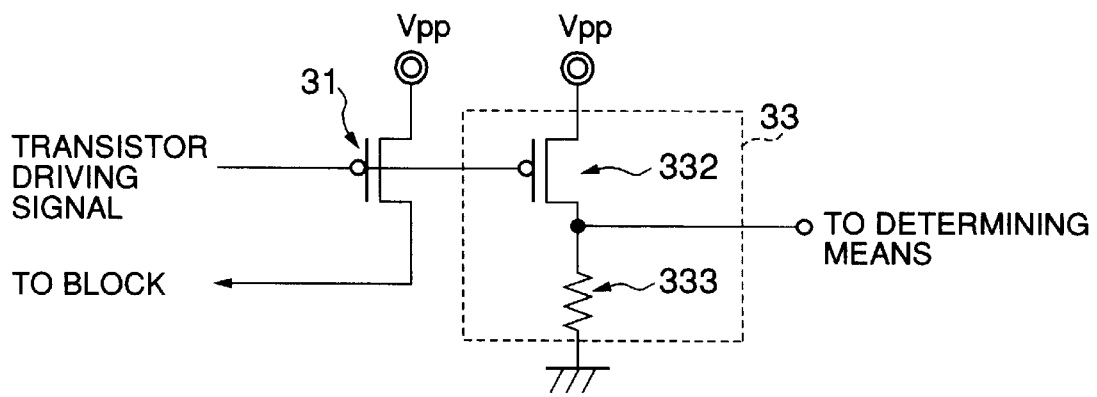
FIG. 4 is a specific example showing the structure of an erase address detection circuit in the first embodiment.

More specifically, as shown in FIG. 4, the erase address detection circuit 33 comprises a transistor 332 and a resistor 333. The gate of the transistor 332 is connected to the gate of the erase transistor 31. The erase address detection circuit 33 having such a structure outputs power supply voltage $V_{pp}$ to the determination means (not shown) from a node between the drain of the transistor 332 and the resistor 333 when the erase transistor 31 is turned on.

A block erase test method comprising the following first to fifth steps can be conducted in the nonvolatile semiconductor memory having the above-stated structure in the first embodiment.

Namely, in the first step, a test signal is turned on, the even number block group (or odd number block group) is designated and an erase test is conducted to batch-erase the even number block group (or odd number block group).

In the second step, it is verified that the even number block group (or odd number block group) is normally erased in the first step and that the even number block group (or odd number block group) and the odd number block group (or even number block group) do not interfere with each other. After verification, "1" (or "0") is written to all of the blocks.

In the third step, a test signal is turned on, the odd number block group (or even number block group) is designated and an erase test is conducted to batch-erase the odd number block group (or even number block group).

In the fourth step, it is verified that the odd number block group (or even number block group) is normally erased in the third step. After verification, "1" (or "0") is written to all of the blocks.

In the above-stated example, it is verified that the even number block group and the odd number block group do not interfere with each other in the second step. Therefore, it is not verified that the odd number block group and the even number block group do not interfere with each other in the fourth step. However, if it is considered that adjacent blocks are connected to each other or interfere with each other like a diode, it may be verified that the odd number block group (or even number block group) is normally erased and that the odd number block group (or even number block group) and the even number block group (or odd number block group) do not interfere with each other in the fourth step.

If it is confirmed that erase operation is normally conducted only if the erase transistor is turned on in the first to fourth steps, the following fifth step is conducted. It is noted that verification/write operations are carried out using a structure (not shown) conventionally provided in the nonvolatile semiconductor memory in the second and fourth steps.

In the fifth step, a test signal is turned off, it is determined whether or not erase transistors 31 are turned on in accordance with block address signals designating the corresponding blocks B0 to B31, respectively. In which order the block address signals designate the plurality of blocks B0 to B31 or the like can be arbitrarily set.

According to the test method described above, it is confirmed that blocks are erasable only if the erase transistors 31 are turned on, respectively in the first to fourth steps. Therefore, in the fifth step, there is no need to waste time by waiting until block erasure is completed. It is only necessary to detect whether the erase transistor 31 is turned on. Due to this, if time required for erasing data once is about two seconds, it takes about four seconds to erase the even number block group and the odd number block groups. Meanwhile, the switching of the erase transistor 31 is conducted at timing on a nanosecond-time scale and is negligible when considering erase time. As a result, in the block erase test method according to the present invention, it takes about four seconds to complete the test. By contrast, in the conventional method, it takes about 64 seconds if block erase tests are conducted to blocks individually. As can be understood from the comparison, the present invention can shorten time by about one minute per memory cell array.

A nonvolatile semiconductor memory in the second embodiment according to the present invention is a modified version of that in the first embodiment. Elements in this embodiment are the same as those in the first embodiment except for an erase address detection circuit. Description thereto will not be therefore given.

Figure 5:
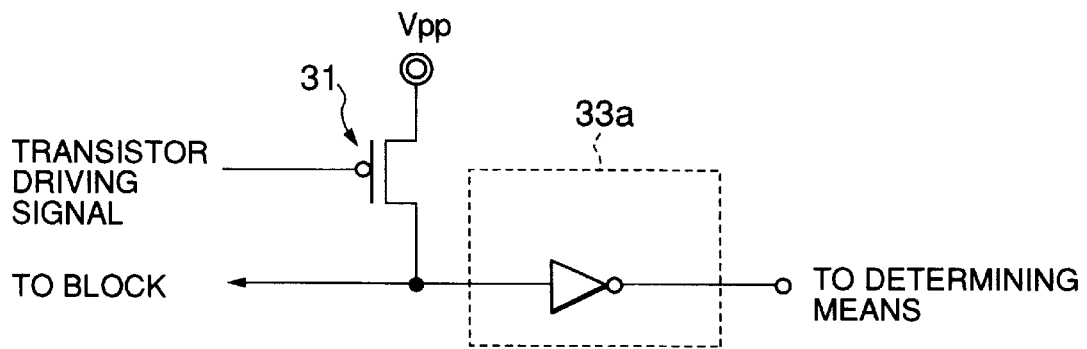
FIG. 5 is a specific example showing the structure of an erase address detection circuit in the second embodiment according to the present invention.

The nonvolatile semiconductor memory in the second embodiment is characterized by comprising an erase address detection circuit 33a as shown in FIG. 5. To be specific, the erase address detection circuit 33a consists of an inverter and inputs the potential of the drain of the erase transistor 31.

In the nonvolatile semiconductor memory having the erase address detection circuit 33a of such a structure, therefore, if an erase transistor 31 is turned on, "0" is outputted to the determination means. As a result, it is possible to determine whether or not predetermined voltage is supplied to the source line.

Operations of the other elements as well as the test method in this embodiment are the same as those in the first embodiment, which description will not be therefore given.

As in the case of the second embodiment, a nonvolatile semiconductor memory in the third embodiment according to the present invention is a modified version of that in the first embodiment and elements except for an erase address detection circuit in this embodiment are the same as those in the first embodiment. Therefore, description will not be given thereto.

Figure 6:
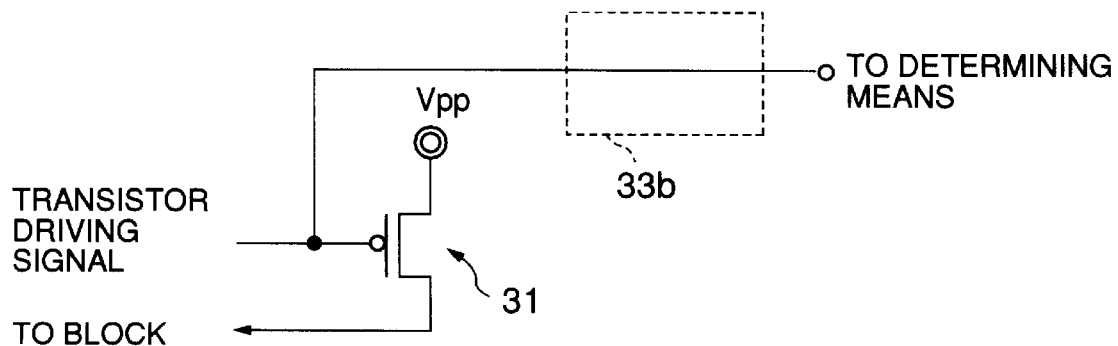
FIG. 6 is a specific example showing the structure of an erase address detection circuit in the third embodiment according to the present invention.

The nonvolatile semiconductor memory in this embodiment is characterized by comprising an erase address detection circuit 33b as shown in FIG. 6. To be specific, the erase address detection circuit 33b consists of nothing more than a line connected to the gate of the erase transistor 31. The circuit 33b directly observes a transistor drive signal for driving the erase transistor 31 and determines whether or not address designation is precisely conducted.

Operations of the other elements as well as the test method in this embodiment are the same as those in the first embodiment, which description will not be therefore given.

A nonvolatile semiconductor memory in the fourth embodiment according to the present invention differs from that in the first embodiment in block unit.

Figure 7:
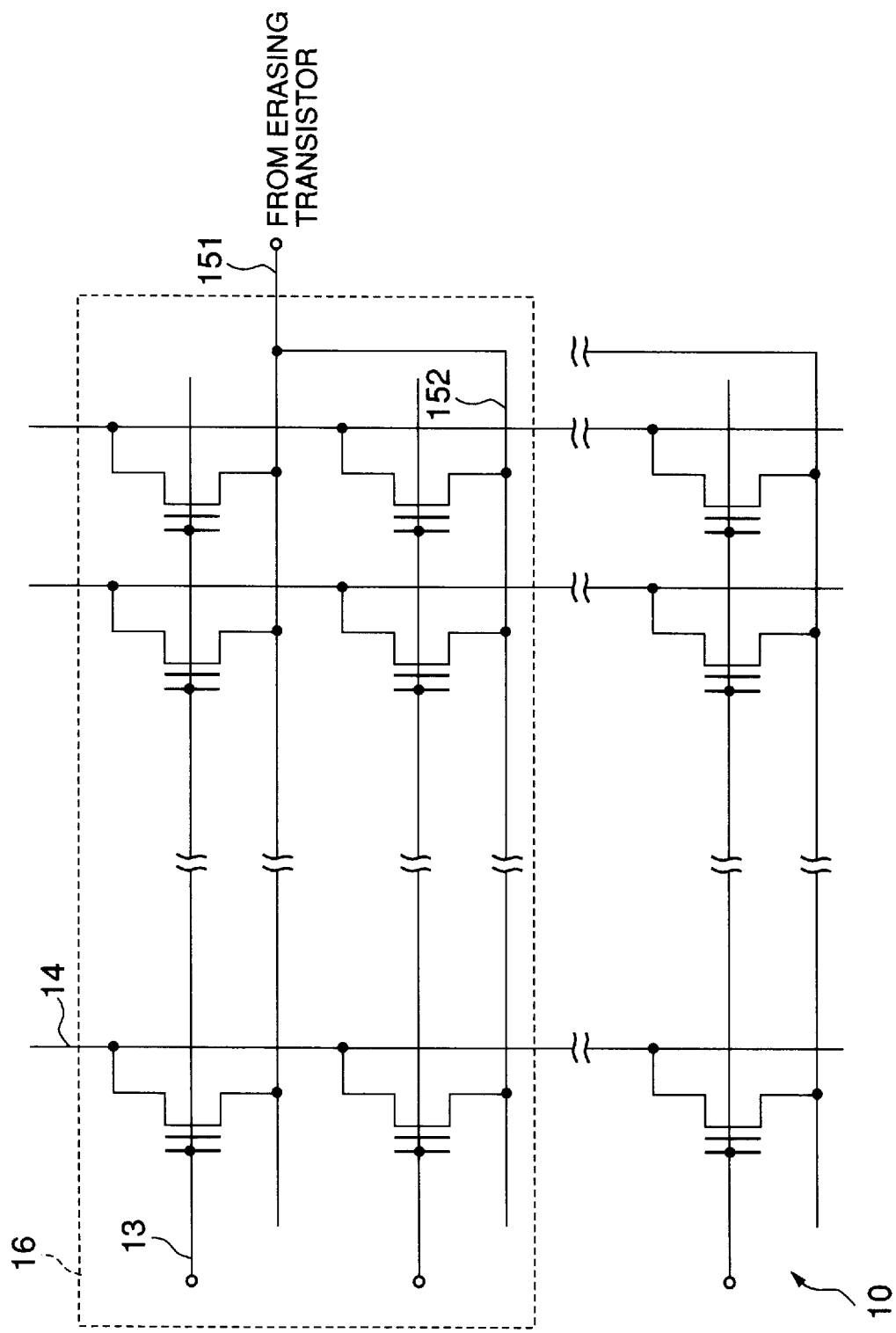
FIG. 7 shows a memory cell array and block units in the fourth embodiment according to the present invention.

Namely, in the first embodiment, a block is equivalent to one row in the memory cell array 10 as has been described with reference to FIG. 2. In this embodiment, a block is equivalent to two rows in the memory cell array 10 as shown in FIG. 7.

In addition, in the block 16 in this embodiment, two word lines 13 are provided for respective rows, independently of each other and two source lines 151 and 152 are integrated into one line, that is, the source lines 151 and 152 forms a wired OR. During block erase operation, predetermined voltage is supplied to the integrated line through the erase transistor.

Operations of the other elements as well as the test method in this embodiment are the same as those in the first embodiment except for the above respect. Description thereto will not be therefore given.

Although this embodiment has been described as a verified version of the first embodiment, it is of course applicable to the second and third embodiments.

Furthermore, it is possible to change the block unit to three rows or more based on the principle of this embodiment.

A flash memory is exemplified as a memory cell in the first to fourth embodiments (although it is not explicitly mentioned in the description but illustrated in the drawings). However, the memory cell should not be limited to a flash memory.

Figure 8:
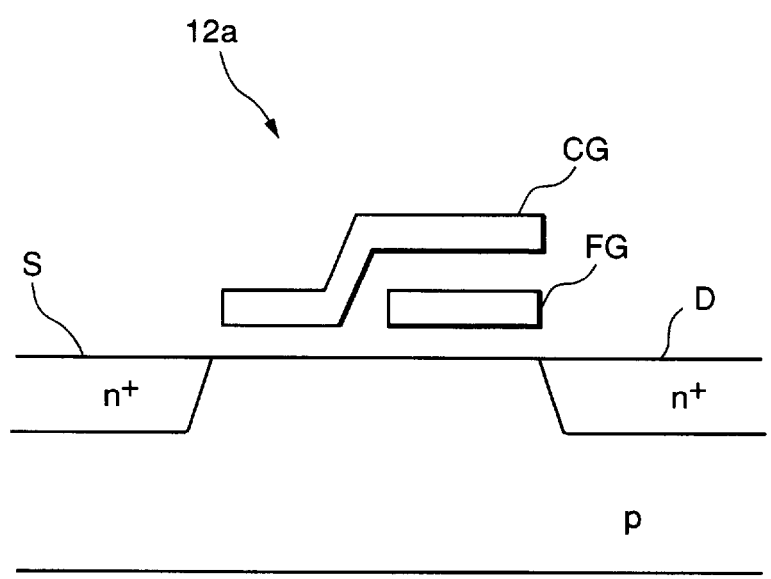
FIG. 8 shows the structure of a memory cell in the fifth embodiment according to the present invention.

A nonvolatile semiconductor memory in the fifth embodiment according to the present invention characteristically comprises memory cells 12a as shown in FIG. 8.

Figure 9:
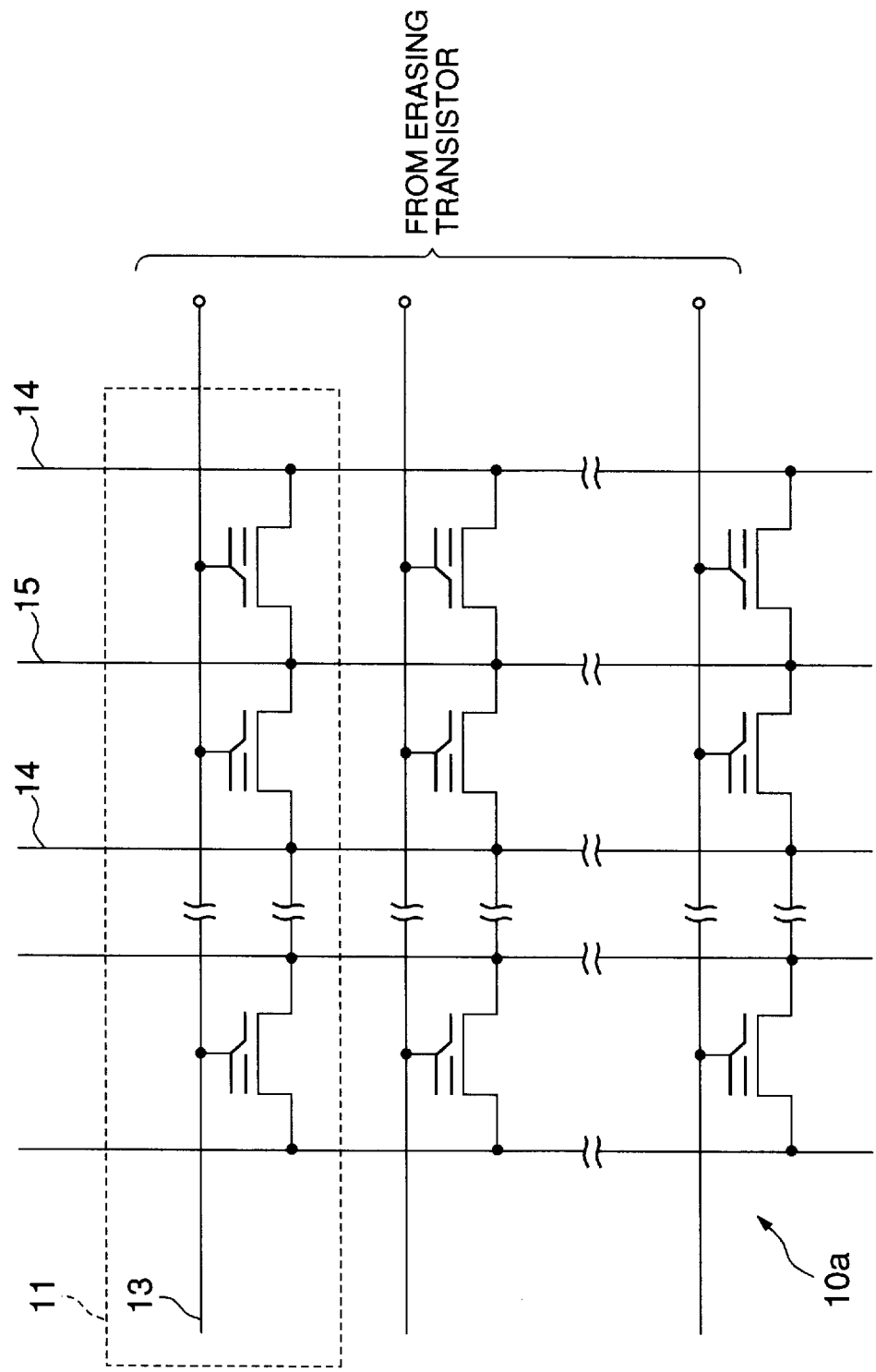
FIG. 9 shows a memory cell array in the fifth embodiment.

Specifically, the nonvolatile semiconductor memory in the fifth embodiment according to the present invention comprises a memory cell array 10a having a structure in which the source and drain of a memory cell 12a is connected to the source and drain of the adjacent memory cell 12a, respectively, as shown in FIG. 9.

The unit of a block 11 in this embodiment is equivalent to one row in the memory cell array 10. In each row, a word line 13 operates as an erase line supplied with predetermined voltage from an erase circuit during block erase operation.

Since the applicable erase circuit, block erase test method and the like are the same in those described in the first to third embodiments, description thereto will not be given herein.

A nonvolatile semiconductor memory in the sixth embodiment according to the present invention is a modified version of that in the fifth embodiment.

Figure 10:
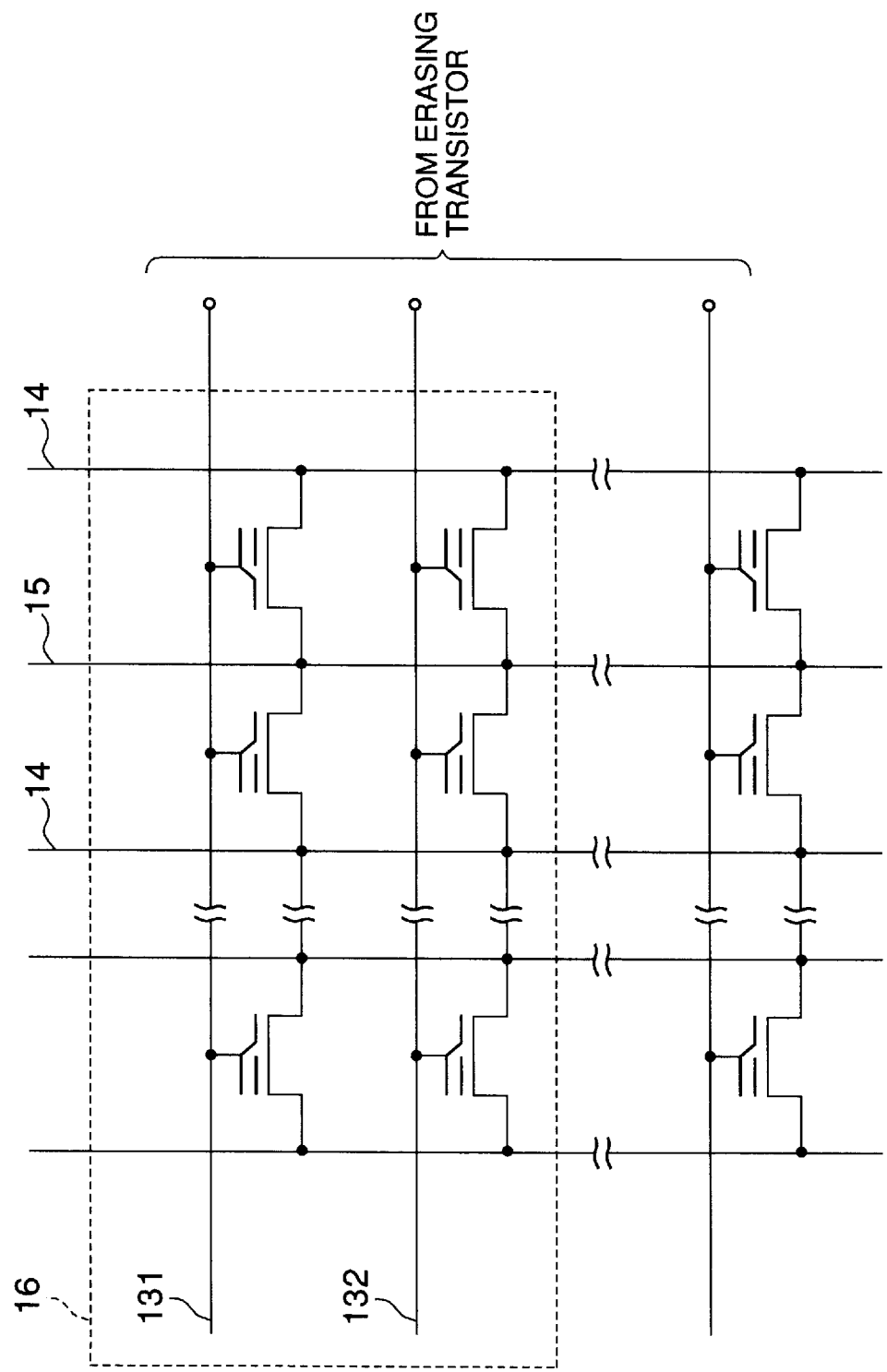
FIG. 10 shows a memory cell array and block units in a sixth embodiment according to the present invention.
Figure 11:
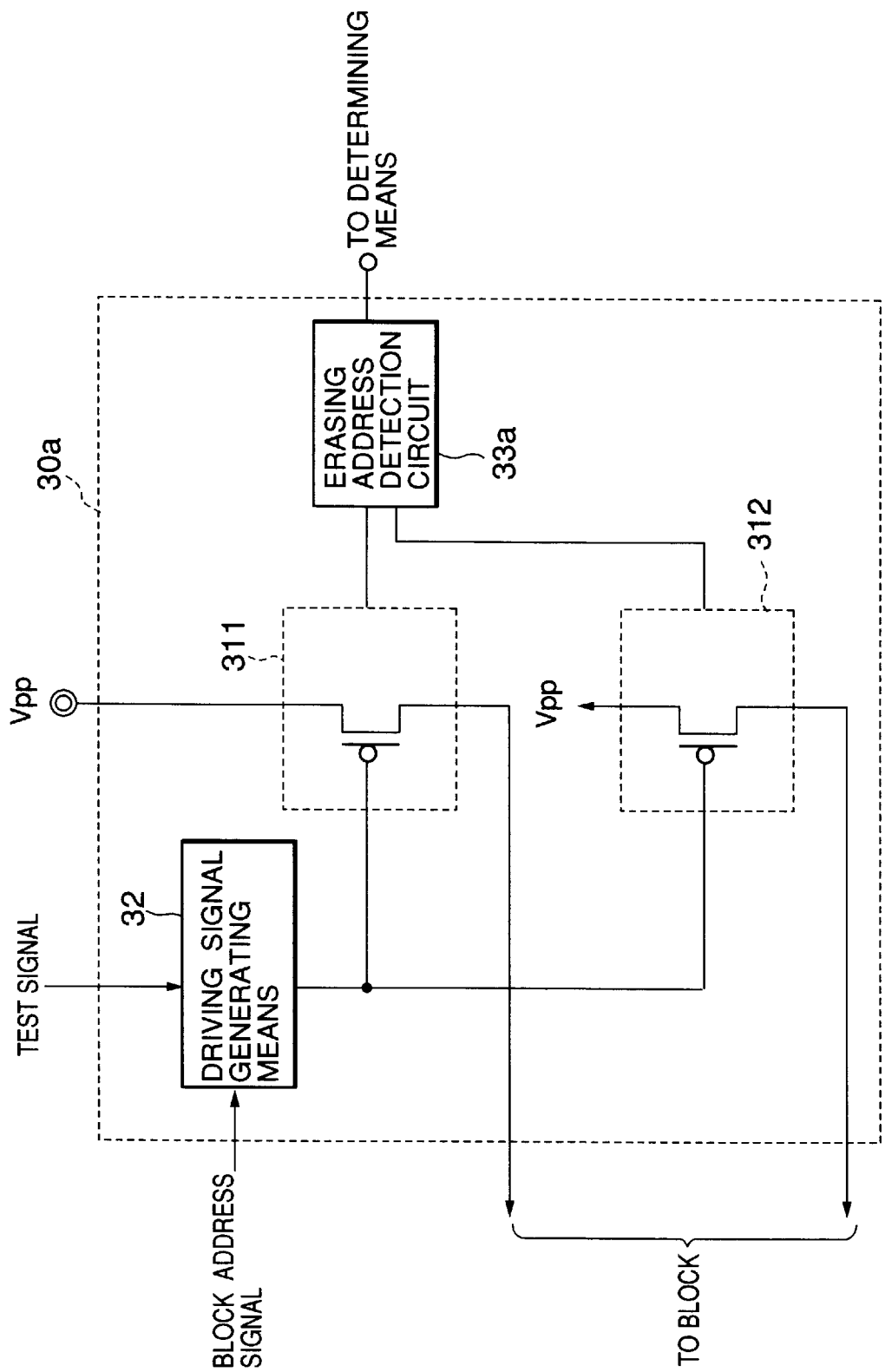
FIG. 11 is a block diagram showing the structure of an erase address detection circuit in the sixth embodiment.

As can be understood with reference to FIG. 10, the sixth embodiment differs from the fifth embodiment in block unit. That is, in this embodiment, the unit of a block 16 is equivalent to two rows in the memory cell array 10a.

It should be noted as follows. In the fourth embodiment, a source line operates as an erase line and no problem occurs if connection state is simple. In this embodiment, by contrast, word lines 131 and 132 operates as erase lines. Due to this, a short-circuit, if occurs between the two word lines 131 and 132, has an adverse effect on bit address designation such as read and write operations.

Therefore, in this embodiment, an erase circuit 30a comprises two erase transistors 311 and 312 for supplying predetermined voltage to word lines, independently of each other. An erase address detection circuit 33a inputs states concerning the two erase transistors 311 and 312 and outputs an erase address detection signal.

Figure 12:
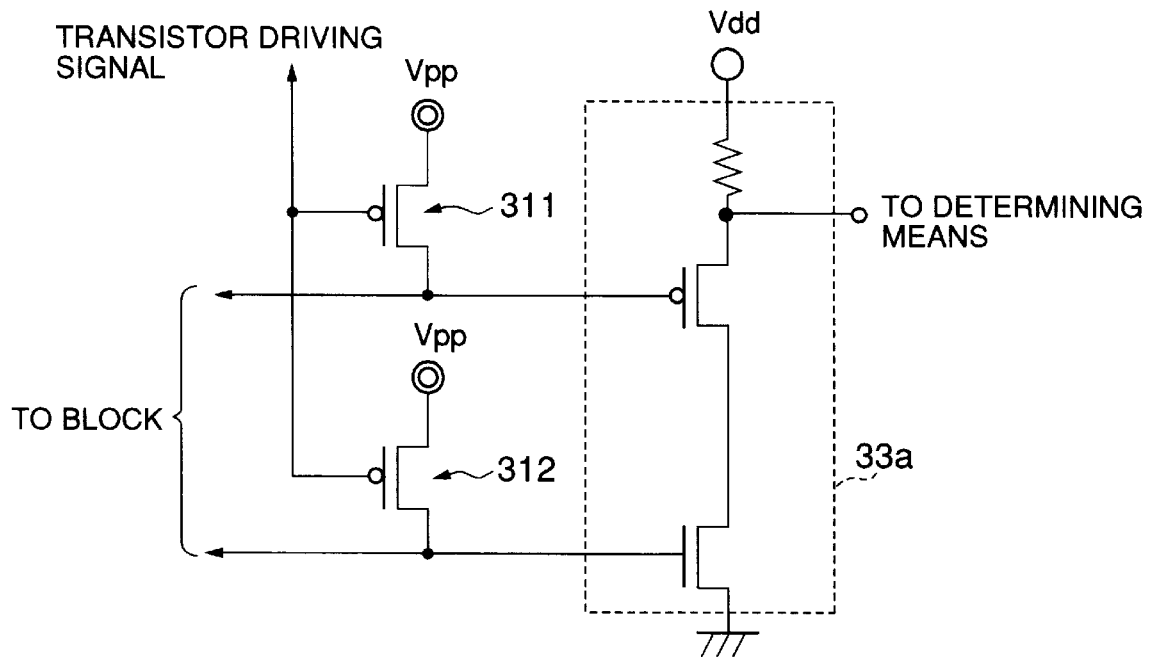
FIG. 12 is a specific example showing the structure of an erase address detection circuit in the sixth embodiment.
Figure 13:
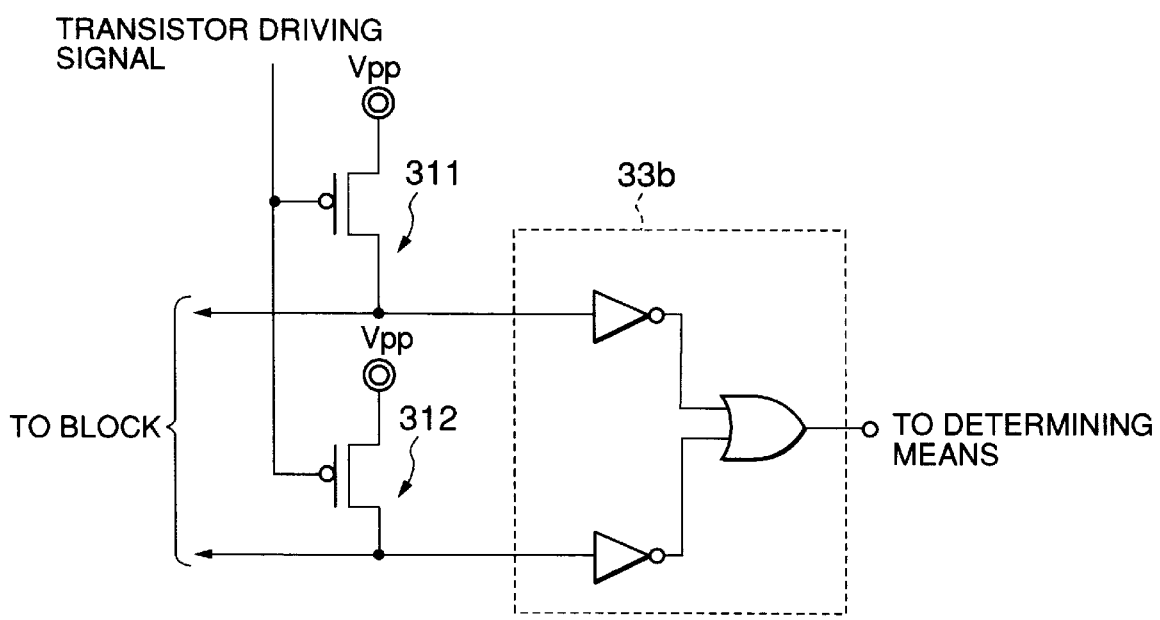
FIG. 13 is another specific example showing the structure of the erase address detection circuit in the sixth embodiment.

Specifically, the erase address detection circuit 30a in this embodiment is exemplified by erase address detection circuits 33a and 33b having structures shown in FIG. 12 and 13, respectively.

The erase address detection circuit 33a shown in FIG. 12 is a two-input NAND circuit consisting of two nMOS transistors and it inputs potentials of drains of the two erase transistors 311 and 312.

The erase address detection circuit 33b shown in FIG. 13 comprises two inverters and a two-input OR circuit and it inputs potentials of drains of the two erase transistors 311 and 312.

Each of the two erase address detection circuits 33a and 33b outputs "0" as an erase address detection signal if the two erase transistors 311 and 312 are turned on.

Operations of the other elements as well as the test method in the nonvolatile semiconductor memory having the above structure in this embodiment are the same as those in the first embodiment. Description thereto will not be therefore given herein.

In this embodiment, it is described that the block unit is equivalent to two rows in the memory cell array. It goes without saying that the present invention is applicable to a case where a block unit is equivalent to three rows or more.

As described so far, the present invention can provide a nonvolatile semiconductor memory capable of greatly shortening erase test time.

Assuming that, for example, a memory cell array consists of 32 blocks and time required for erasing block once is about two seconds, the overall block erase time is shorter than in the case of the conventional memory by nearly one minute.

What is claimed is:

1. A nonvolatile semiconductor memory comprising:

a memory cell array having a plurality of blocks consisting of a plurality of memory cells;

block address signal generation means for generating a block address signal for designating a block which data is to be erased; and a plurality of erase circuits provided corresponding to said plurality of blocks, for erasing data of the corresponding blocks in response to said block address signal, respectively and wherein each of said plurality of erase circuits comprises:

an erase transistor operating as a switching device for supplying desired, predetermined voltage to the corresponding block in accordance with the block address signal; and an erase address detection circuit for outputting an erase address detection signal indicating whether the erase transistor supplies said predetermined voltage to said corresponding block.

2. A nonvolatile semiconductor memory according to claim 1, wherein each of said plurality of erase circuits further comprises drive signal generation means for determining whether to drive said erase transistor in response to an erase test signal sent from outside and designating a form of an erase test and to said block address signal, and for outputting a transistor drive signal to said erase transistor when it is determined to drive said erase transistor.

3. A nonvolatile semiconductor memory according to claim 2, wherein said block address signal is a binary bit string having a plurality of bits;

when said erase test signal is turned on, each of said drive signal generation means determines whether to drive a corresponding erase transistor depending on whether a corresponding block is an even number block or an odd number block in said memory cell array, in accordance with a least significant bit of said binary bit string constituting said block address signal, and outputs said transistor drive signal to said corresponding erase transistor when the corresponding erase transistor is driven; and when said erase test signal is turned off, each of said drive signal generation means determines whether to drive the corresponding erase transistor only in accordance with said block address signal, and outputs said transistor drive signal to said corresponding erase transistor when the corresponding erase transistor is drive.

4. A nonvolatile semiconductor memory according to claim 1, wherein sources of a plurality of memory cells of each block are connected to a source line in the block; and the source line is connected to a corresponding erase transistor and said predetermined voltage is supplied to the source line.

5. A nonvolatile semiconductor memory according to claim 1, wherein gates of a plurality of memory cells of each block are connected to an erase line; and the erase line is connected to a corresponding erase transistor and said predetermined voltage is supplied to the erase line.

* * * * *